(12) United States Patent
Rana et al.

(10) Patent No.: US 11,935,607 B2
(45) Date of Patent: Mar. 19, 2024

(54) CIRCUIT AND METHOD TO DETECT WORD-LINE LEAKAGE AND PROCESS DEFECTS IN NON-VOLATILE MEMORY ARRAY

(71) Applicant: STMicroelectronics International N.V., Geneva (CH)

(72) Inventors: Vikas Rana, Noida (IN); Vivek Tyagi, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 46 days.

(21) Appl. No.: 17/837,377

(22) Filed: Jun. 10, 2022

(65) Prior Publication Data

US 2023/0008272 A1    Jan. 12, 2023

Related U.S. Application Data

(60) Provisional application No. 63/218,621, filed on Jul. 6, 2021.

(51) Int. Cl.
| | |
|---|---|
| *G11C 29/12* | (2006.01) |
| *G11C 29/18* | (2006.01) |
| *G11C 29/44* | (2006.01) |
| *G11C 29/52* | (2006.01) |

(52) U.S. Cl.
CPC ........ *G11C 29/12005* (2013.01); *G11C 29/18* (2013.01); *G11C 29/4401* (2013.01); *G11C 29/52* (2013.01); *G11C 2029/1202* (2013.01); *G11C 2029/1204* (2013.01); *G11C 2029/1802* (2013.01)

(58) Field of Classification Search
CPC ..... G11C 29/18; G11C 29/44; G11C 29/4401; G11C 29/52; G11C 29/12005
See application file for complete search history.

(56) References Cited

U.S. PATENT DOCUMENTS

| | | | | |
|---|---|---|---|---|
| 6,836,179 | B2 * | 12/2004 | Mizuno | G11C 11/413 |
| | | | | 327/544 |
| 7,990,208 | B2 * | 8/2011 | Mizuno | G11C 5/147 |
| | | | | 327/543 |
| 10,032,524 | B2 * | 7/2018 | Sabde | G11C 29/025 |
| 2013/0107640 | A1 * | 5/2013 | Yamada | G11C 8/08 |
| | | | | 365/226 |
| 2019/0006020 | A1 * | 1/2019 | Sundaresan | G11C 29/12005 |
| 2019/0279732 | A1 * | 9/2019 | Huang | G11C 29/50 |

* cited by examiner

*Primary Examiner* — Tuan T Nguyen
(74) *Attorney, Agent, or Firm* — Crowe & Dunlevy LLC

(57) ABSTRACT

An integrated circuit die includes memory sectors, each memory sector including a memory array. The die includes a voltage regulator with a first transistor driven by an output voltage to thereby generate a gate voltage, the output voltage being generated based upon a difference between a constant current and a leakage current. A selection circuit selectively couples the gate voltage to a selected one of the plurality of memory sectors. A leakage detector circuit drives a second transistor with the output voltage to thereby generate a copy voltage based upon a difference between a variable current and a replica of the constant current, increases the variable current in response to the copy voltage being greater than the gate voltage, and asserts a leakage detection signal in response to the copy voltage being less than the gate voltage, the leakage detection signal indicating excess leakage within the memory array.

21 Claims, 13 Drawing Sheets

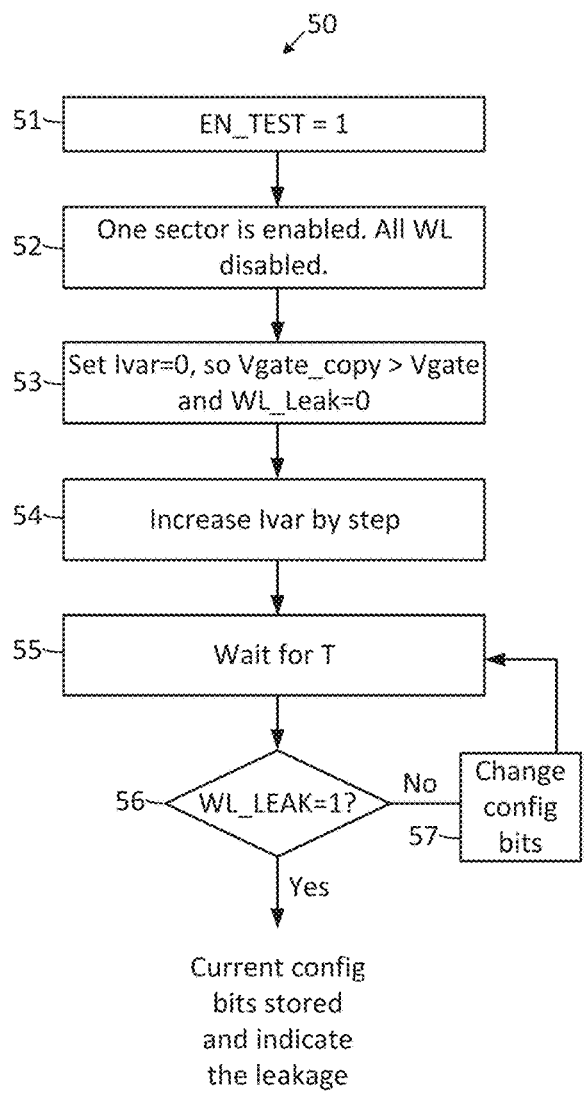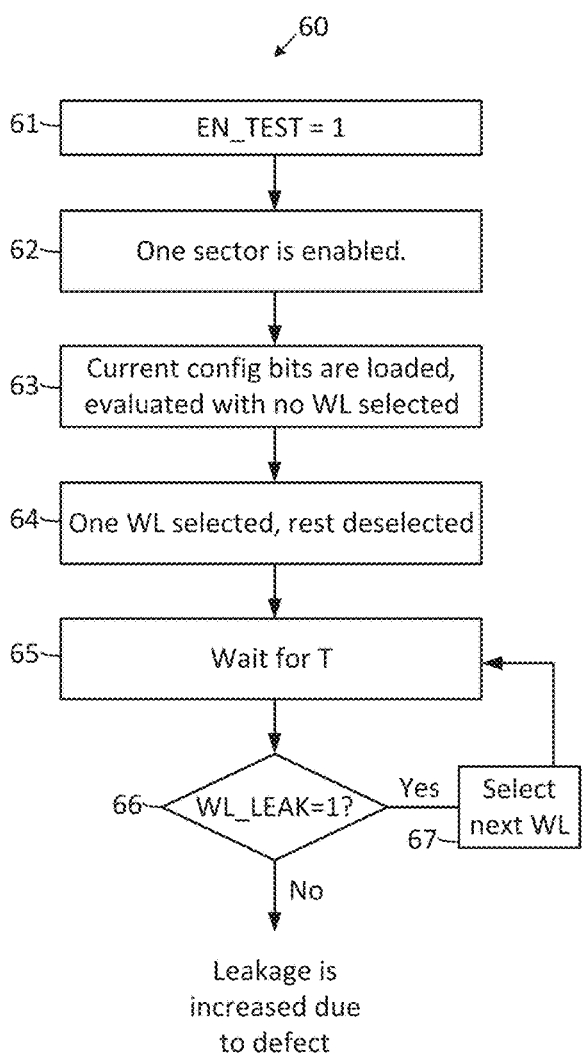
FIG. 3A
FIG. 3B

CIRCUIT AND METHOD TO DETECT WORD-LINE LEAKAGE AND PROCESS DEFECTS IN NON-VOLATILE MEMORY ARRAY

RELATED APPLICATION

This application claims priority to U.S. Provisional Application for Patent No. 63/218,621, filed Jul. 6, 2021, the contents of which are incorporated by reference in their entirety.

TECHNICAL FIELD

This disclosure is related to the field of non-volatile memory and, in particular, to circuitry and techniques for determining the presence of process defects in a non-volatile memory array as shown by excess row decoder leakage, word-line leakage, and bit-line leakage. This disclosure provides for on-chip testing circuitry that can be used at the electric wafer sort stage of fabrication.

BACKGROUND

Non-volatile memory (NVM) is used in many electronic devices in the modern world. NVM is formed on dedicated die, or on die with other components (e.g., a system on a chip).

As shown in FIG. 1, during fabrication, multiple die 11 containing NVM arrays are formed on a wafer 10. A sample die 11 includes i sectors Sector[0], . . . , Sector[i], with each sector containing an array 19 of memory cells C arranged in rows and columns. Each array 19 has a size of m×n, with m being the number of columns and n being the number of rows. The memory cells C in each row are controlled by a word line from among word lines WL[0], . . . , WL[n], and the memory cells C in each column may be read out or written to via bit lines/complementary bit line pairs BL[0], . . . , BL[m]. A row decoder and level shifting circuit 15 receives a row address that is predecoded from an address and decodes the bits of the row address. A column decoder circuit 17 receives a column address that is predecoded from the address and decodes the bits of the column address.

In read mode, the Sector[0], . . . , Sector[i] to be selected for reading/writing may be determined from the address, and is selected by actuation of an associated switch S0, . . . , Si. A switch Sw is closed to connect a read regulator 12 to the selected sector. The column address is used by the column decoder 17 is used to select a plurality of the bit lines BL[0], . . . , BL[m] via a column multiplexer 18, and the row address is used by the row decoder 15 to select and actuate one of the word lines WL[0], . . . , WL[n] by asserting that word line through a respective word line driver D0, . . . , Dn. The word line drivers D0, . . . , Dn are fed by the read voltage Vread.

During fabrication, it is desired to know whether the NVM array on a given die contains process errors, evidenced by excess leakage current through the row decoder, or excess leakage current through the word-lines, or excess leakage current through the bit-lines. Conventionally, this is performed by opening the switch Sw providing the read voltage Vread to the word line drivers D0, . . . , Dn, closing a test enable switch S_EN_test, and forcing an external read voltage onto a pad 13 connected to the selected sector Sector[0], . . . , Sector[i] for use by its row decoder 15. By monitoring the current drawn from an external voltage supply (not explicitly shown) which supplies the external voltage and comparing that current to an expected current, it can be determined whether the die 11 has suffered from a process error.

While this technique works, it consumes excess on-chip area due to the requirement for an extra pad for application of the external read voltage. In addition, due to the usage of the external read voltage, an external test apparatus is needed to perform the test, rendering the testing of large batches of such die 11 to be slow and burdensome.

As such, further development into ways to determine whether a NVM array on a die has suffered a process error is needed.

SUMMARY

Disclosed herein is an integrated circuit die including a plurality of memory sectors, each memory sector including a memory array. The integrated circuit die has a voltage regulator including a first transistor driven by an output voltage to thereby generate a gate voltage, the output voltage being generated based upon a difference between a constant current and a leakage current. A selection circuit is configured to selectively couple the gate voltage to a selected one of the plurality of memory sectors. A leakage detector circuit is configured to: drive a second transistor with the output voltage to thereby generate a copy voltage based upon a difference between a variable current and a replica of the constant current; increase the variable current in response to the copy voltage being greater than the gate voltage; and assert a leakage detection signal in response to the copy voltage being less than the gate voltage, the leakage detection signal indicating excess leakage within the memory array of the selected one of the memory sectors.

To detect excess leakage within row decoders of the selected one of the memory sectors, the leakage detector circuit may be configured to: a) deselect all word lines within the memory array of the selected one of the memory sectors; b) set the variable current to have a magnitude that is within a threshold of zero; c) increase the variable current by a given amount, in response to the copy voltage being greater than the gate voltage, and wait a given period of time; d) if the increase in the variable current by the given amount results in the copy voltage becoming less than the gate voltage, assert the leakage detection signal to thereby indicate excess leakage within the row decoders of the selected one of the memory sectors; and e) if the increase in the variable current by the given amount does not result in the copy voltage becoming less than the gate voltage, return to c).

To detect excess leakage within word lines of the selected one of the memory sectors, the leakage detector circuit may be further configured to: f) select a word line within the memory array of the selected one of the memory sectors, while maintaining a remainder of the word lines deselected; g) wait a given period of time; h) if the selection of the word line results in the gate voltage becoming less than the copy voltage, de-assert the leakage detection signal to thereby indicate excess leakage within the selected word line of the selected one of the memory sectors; and i) if the selection of the word line does not result in the gate voltage becoming less than the copy voltage, assert the leakage detection signal to thereby indicate a lack of excess leakage within the selected word line.

To detect excess leakage within bit lines of the selected one of the memory sectors, the leakage detector circuit may be configured to: a) deselect all word lines within the memory array of the selected one of the memory sectors, select one bit line within the memory array; b) set the variable current to have a magnitude that is within a threshold of zero; c) increase the variable current by a given amount, in response to the copy voltage being greater than the gate voltage, and wait a given period of time; d) if the increase in the variable current by the given amount results in the copy voltage becoming less than the gate voltage, assert the leakage detection signal to thereby excess leakage within the bit line; and e) if the increase in the variable current by the given amount does not result in the copy voltage becoming less than the gate voltage, return to c).

BRIEF DESCRIPTION OF THE DRAWINGS

FIG. 3A is a flowchart showing steps for operating the integrated circuit die of FIG. 2 for performing row decoder leakage detection.

FIG. 3B is a flowchart showing steps for operating the integrated circuit die of FIG. 2 for performing word line leakage detection.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
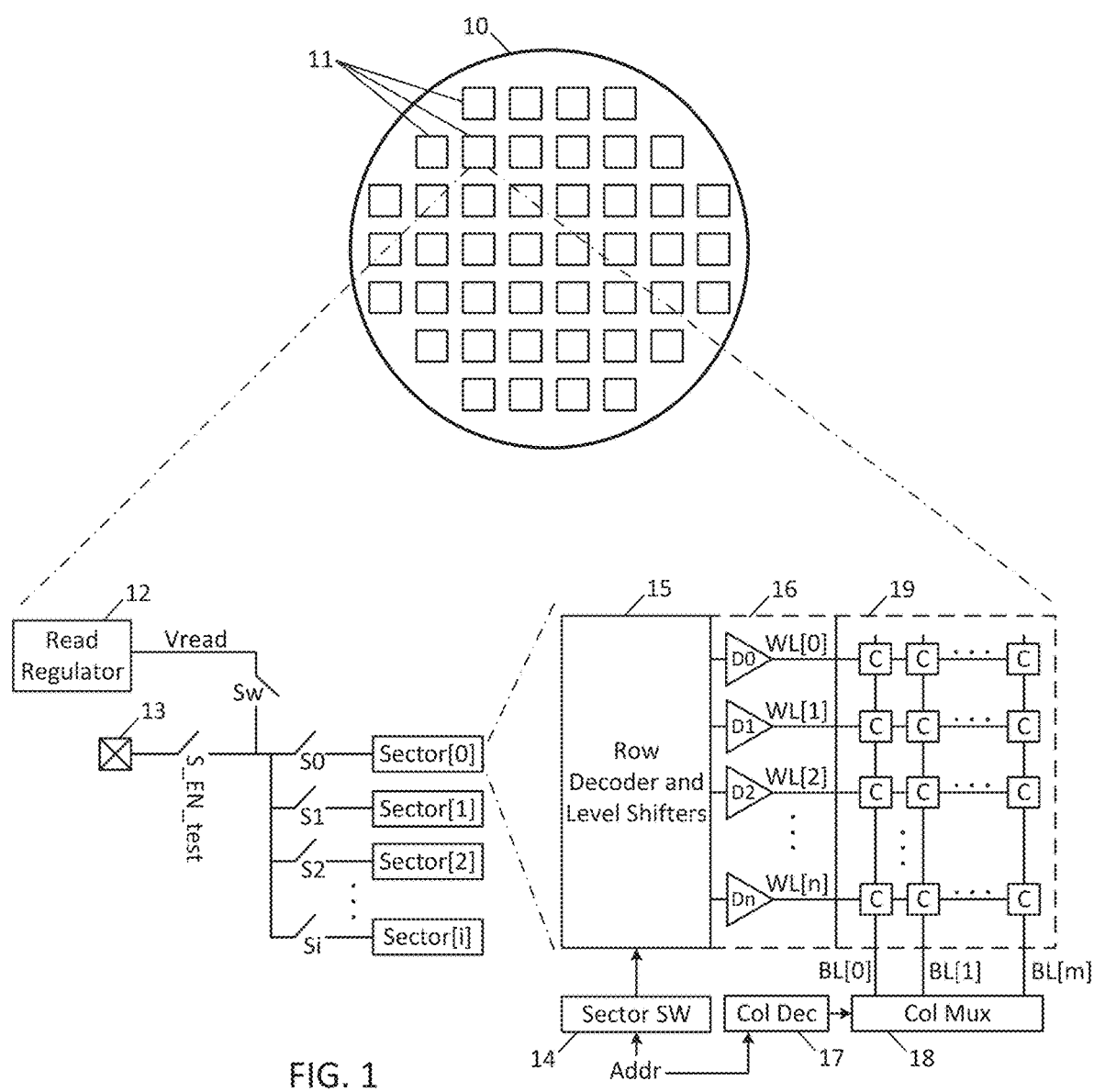
FIG. 1 is a diagrammatical representation of a prior art wafer with multiple integrated circuit die formed thereon, with each integrated circuit die having built in test circuitry usable for performing leakage current testing.
Figure 2:
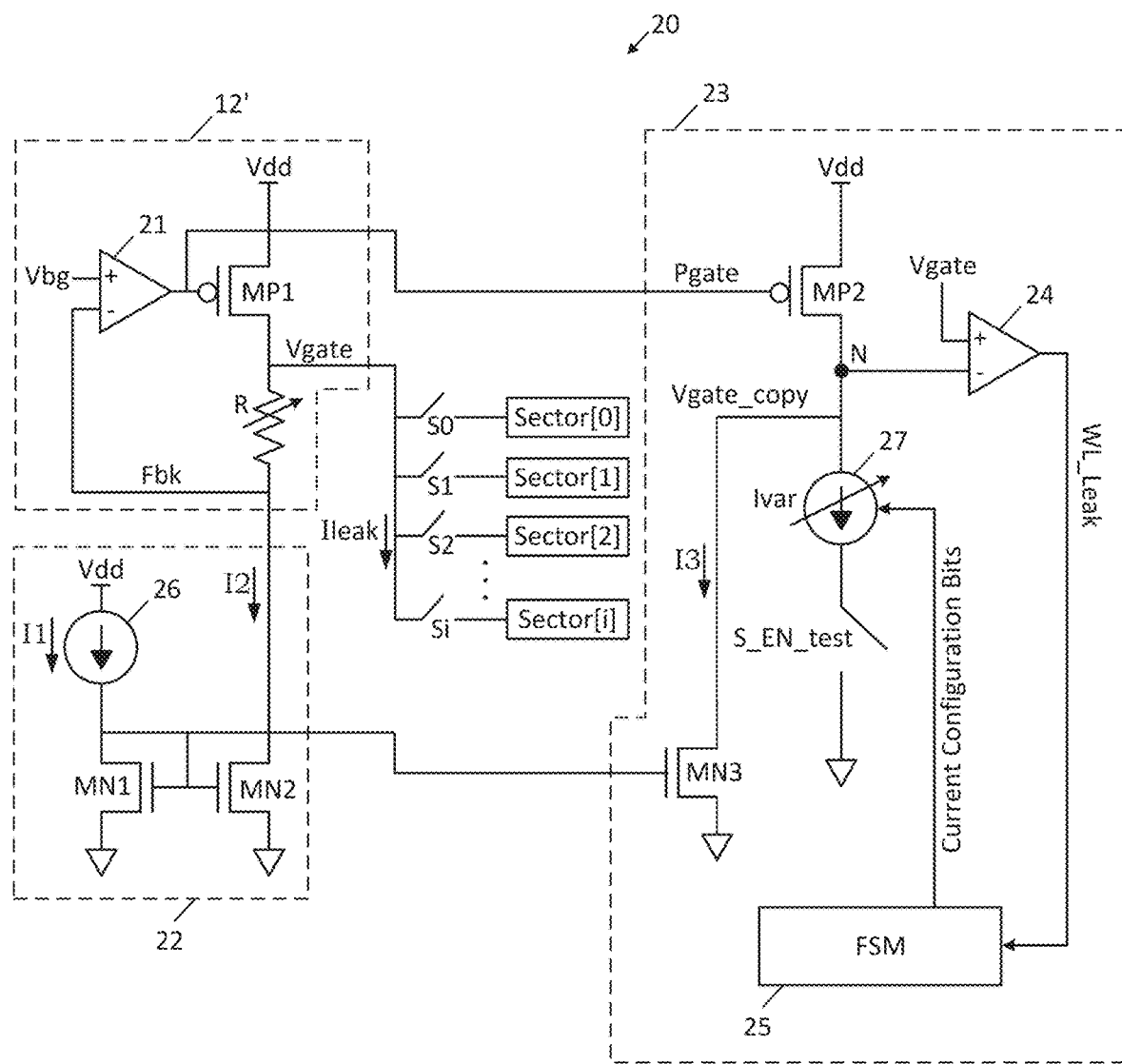
FIG. 2 is a schematic block diagram of a first embodiment of an integrated circuit die having built in test circuitry usable for performing row decoder leakage detection and word line leakage detection, as disclosed herein.

Now described with reference to FIG. 2 is non-volatile memory circuit 20 including a voltage regulator 12' and a leakage detector arrangement 23 that cooperate to measure row-decoder leakage and word line leakage (such as caused by a resistive short) within the memory arrays (not shown for ease of viewing) of the sectors Sector[0], ..., Sector[i]. This non-volatile memory circuit 20 is embodied within an integrated circuit die, and during fabrication of a wafer containing multiple such integrated circuit die, this non-volatile memory circuit may be used at the electrical wafer sort stage in order to determine which integrated circuit die (e.g., chips) are to be discarded, and/or in order to perform binning of the different integrated circuit die on the wafer.

The sectors Sector[0], ..., Sector[i] are selectively connected to receive a gate voltage Vgate by respective switches S0, ..., Si. This gate voltage Vgate is used by the row decoders and word line drivers of the sectors Sector[0], ..., Sector[i]. In particular, the gate voltage Vgate may be used to generate the word line voltages for read/write cycles of the sectors Sector[0], ..., Sector[i].

The voltage regulator 12' generates the gate voltage Vgate. The voltage regulator 12' includes a power MOS transistor, illustratively a PMOS transistor MP1, having its source connected to a supply voltage Vdd, its drain connected to a first terminal of a resistor having an adjustable resistance R, and its gate connected to be driven by the output of an amplifier 21 (which is the voltage Pgate). The amplifier 21 has its non-inverting terminal connected to receive a bandgap (reference) voltage Vbg and has its inverting terminal connected to receive a feedback voltage Fbk produced at a second terminal of the resistor having the adjustable resistance R.

A current I2 is drawn from the second terminal of the resistor having the adjustable resistance R by a current mirror arrangement 22. The current mirror arrangement 22 includes a constant current source 26 connected between the supply voltage Vdd and a drain of an n-channel transistor MN1, the current source 26 generating a constant current I1. The n-channel transistor MN1 has its source connected to ground, and has its gate connected to its drain. The n-channel transistor MN1 is in a current mirror arrangement with an n-channel transistor MN2, so the gates of the n-channel transistors MN1 and MN2 are connected to one another. The n-channel transistor MN2 has its drain connected to the second terminal of the resistor having the adjustable resistance R to sink the current I2 (which is a replica of I1 or a multiple of I1) from the second terminal of the resistor having the adjustable resistance R, has its source connected to ground, and as stated has its gate connected to the gate (and thus also the drain) of n-channel transistor MN1.

The leakage detector arrangement 23 includes a PMOS transistor MP2 that is a replica of the PMOS transistor MP1, which has its source connected to the supply voltage Vdd, its drain connected to a node N, and its gate connected to the output of the amplifier 21 to receive the voltage Pgate. An adjustable current source 27 is connected between node N and a test enable switch S_EN_test. The test enable switch S_EN_test selectively connects the adjustable current source 27 to ground, thereby selectively enabling the adjustable current source 27 to sink a desired current from node N. The adjustable current source 27 receives current configuration bits from a finite state machine (FSM) 25.

An n-channel transistor MN3 is in a current mirror arrangement with n-channel transistors MN1 and MN2, and has its drain connected to node N, its source connected to ground, and its gate connected to the gates of n-channel transistors MN1 and MN2 (as well as to the drain of n-channel transistor MN1). An amplifier 24 (arranged as a comparator) has its non-inverting terminal connected to receive the gate voltage Vgate, its inverting terminal connected to node N, and its output connected to provide the leakage flag WL_Leak to the FSM 25.

Figure 10:
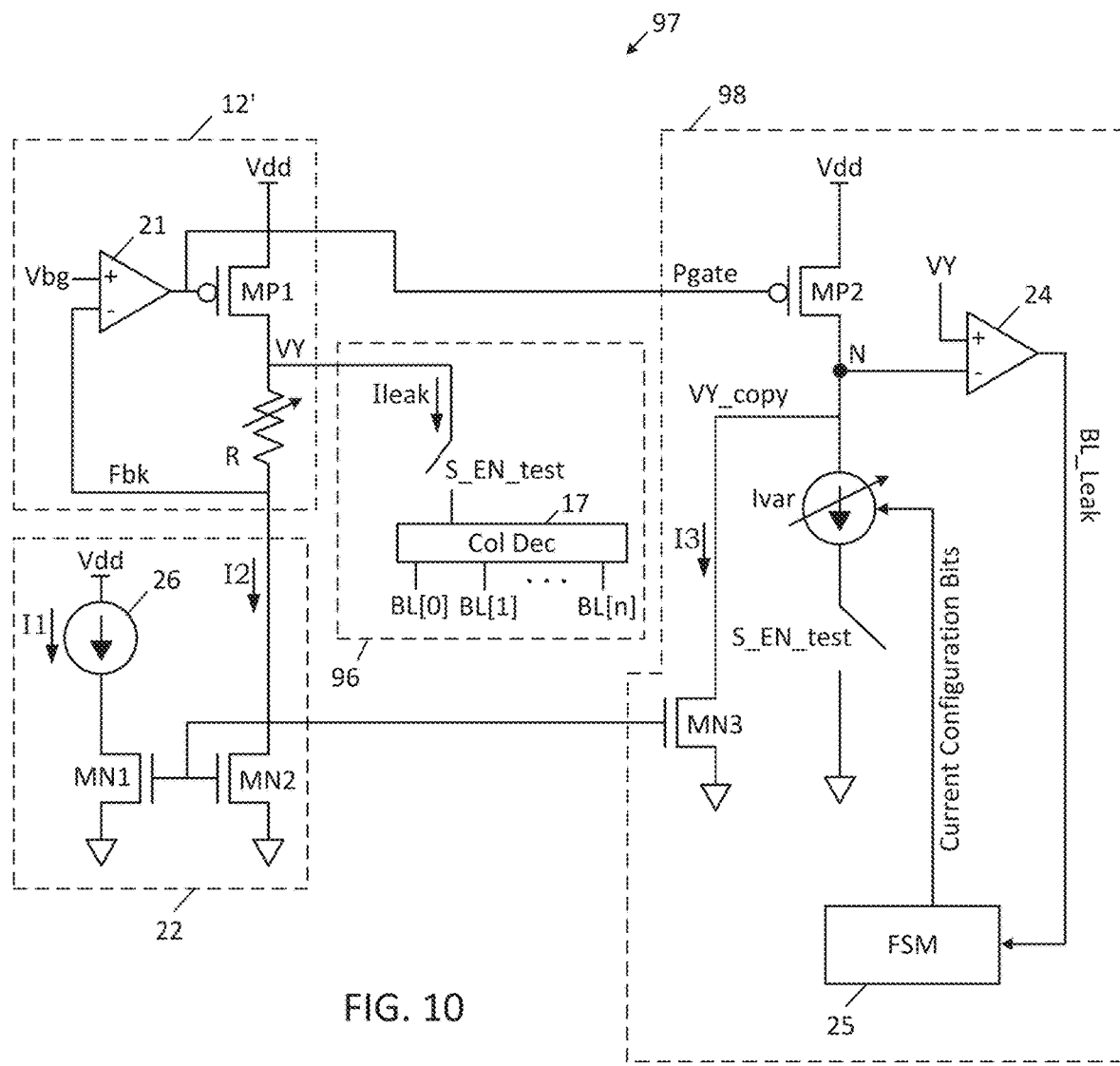
FIG. 10 is a schematic block diagram of a third embodiment of an integrated circuit die having built in test circuitry usable for performing bit line detection, as disclosed herein.
Figure 11:
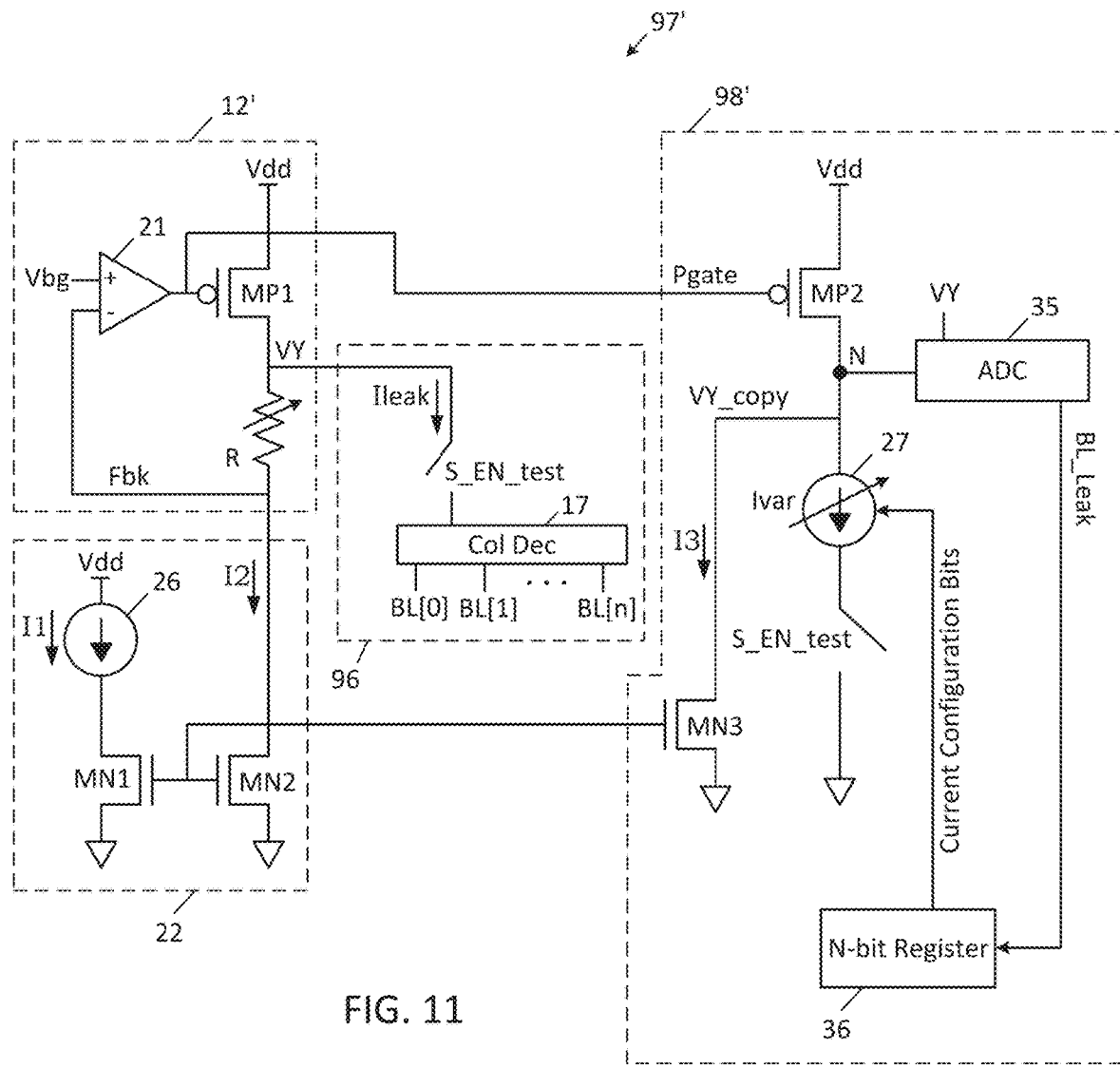
FIG. 11 is a schematic block diagram of a fourth embodiment of an integrated circuit die having built in test circuitry usable for performing bit line detection, as disclosed herein.

Operation of the non-volatile memory circuit 20 in a test mode in which row decoder leakage detection is performed is now described with additional reference to flowchart 50 of FIG. 3A and the graphs of FIGS. 10-11. To begin row decoder leakage detection, a control bit EN_TEST is set (Block 51), enabling the leakage detector arrangement 23, the enabling including closing the S_EN_test switch. At this point, the sector from among sectors Sector[0], . . . , Sector[i] to test is selected (Block 52) by closing its associated switch from among switches S0, . . . , Si, but none of the word lines of the selected sector are selected (e.g., no word line driver in the selected sector is asserting its output).

Then, the FSM 25 sets the configuration bits such that the current Ivar generated by the variable current generator 27 has a magnitude of zero (Block 53). Notice that the gate voltage Vgate is a regulated voltage defined by R*I2+Vbg, and is independent of the leakage current Ileak flowing into the selected sector. On the other hand, the voltage Pgate used to bias the gate of the PMOS transistor MP2 is dependent upon the leakage current Ileak into the selected sector. As the leakage current Ileak increases, the voltage Pgate drops to provide for more overdrive voltage across PMOS transistor MP1 to allow MP1 to provide the requisite current that maintains its drain voltage at Vgate; as the leakage current Ileak decreases, the voltage Pgate increases to provide for less overdrive voltage across PMOS transistor MP1 to reduce the current sourced by MP1 to thereby maintain the drain voltage of MP1 at Vgate.

Keeping that in mind, notice that a copy voltage Vgate_copy is produced at node N. In particular, the voltage Pgate used to bias the gate of the PMOS transistor MP2 causes the PMOS transistor MP2 to source an equal amount of current to node N as is sourced at the drain of the PMOS transistor MP1. The current collectively sunk from node N will be equal to the sum of the currents I2 and Ileak. As a result, while Vgate will remain constant as explained, Vgate_copy will be inversely dependent upon the sum of I3 and Ivar—the greater the magnitude of Ivar is, the less the voltage Vgate_copy will be.

Since the magnitude of the current Ivar at this point (Block 53) is zero, this means that no current is subtracted from I3, and the difference between the drain current of PMOS transistor MP2 and the current I3 (which is a replica of current I1, and therefore is less than the total current sourced by MP1) charges node N to Vgate_copy As a result, at this point, Vgate_copy is greater than Vgate. Since the comparator 24 is arranged as a comparator, Vgate_copy at its inverting terminal being greater than Vgate at its non-inverting terminal means that its output it not asserted—WL_Leak is at a logic low. These conditions can be observed at what is labeled as time T1 in FIGS. 10-11.

Figure 12:
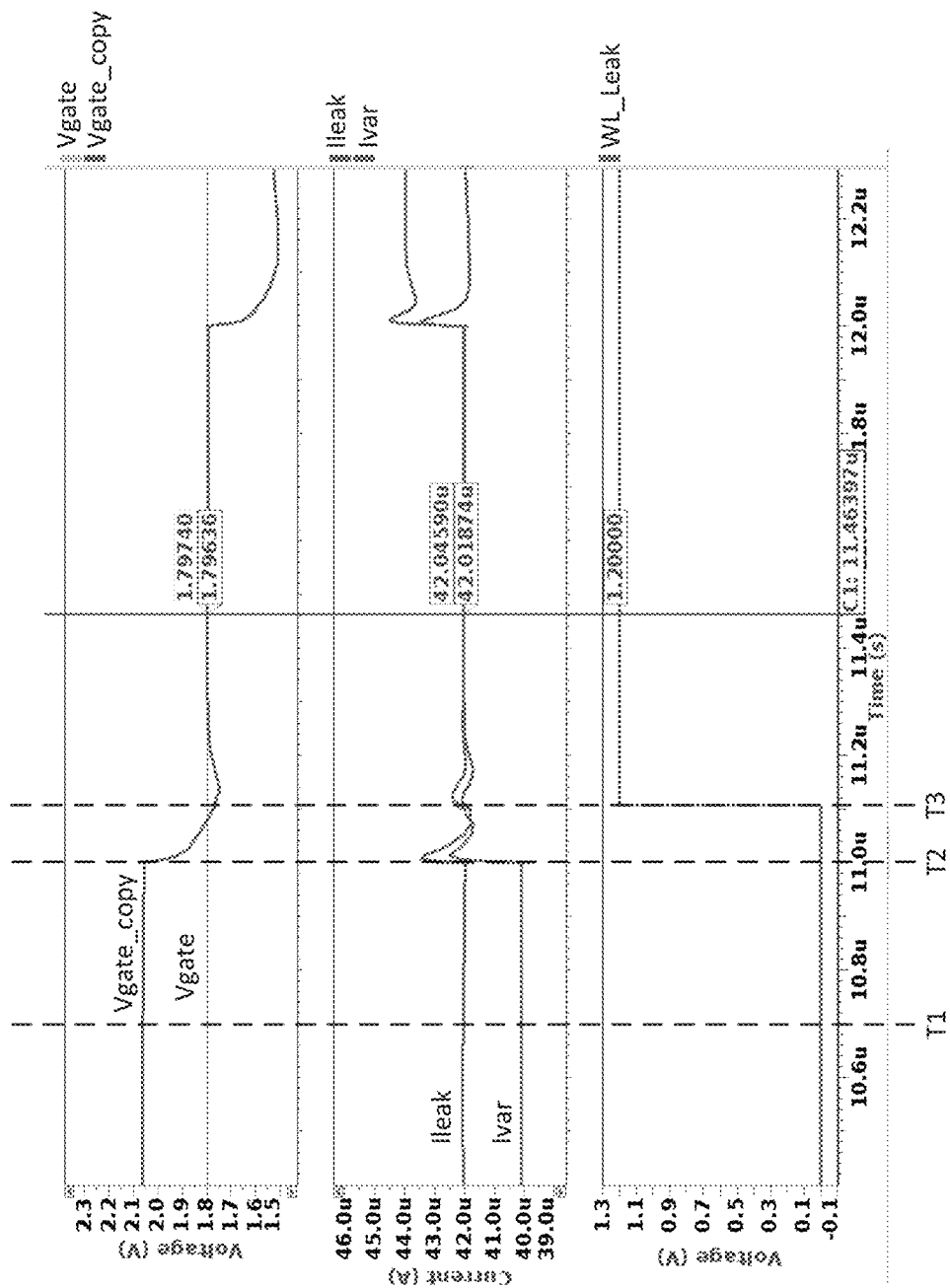
FIG. 12 is a graph showing the integrated circuit die of FIG. 2 in operation when performing row decoder leakage detection.
Figure 13:
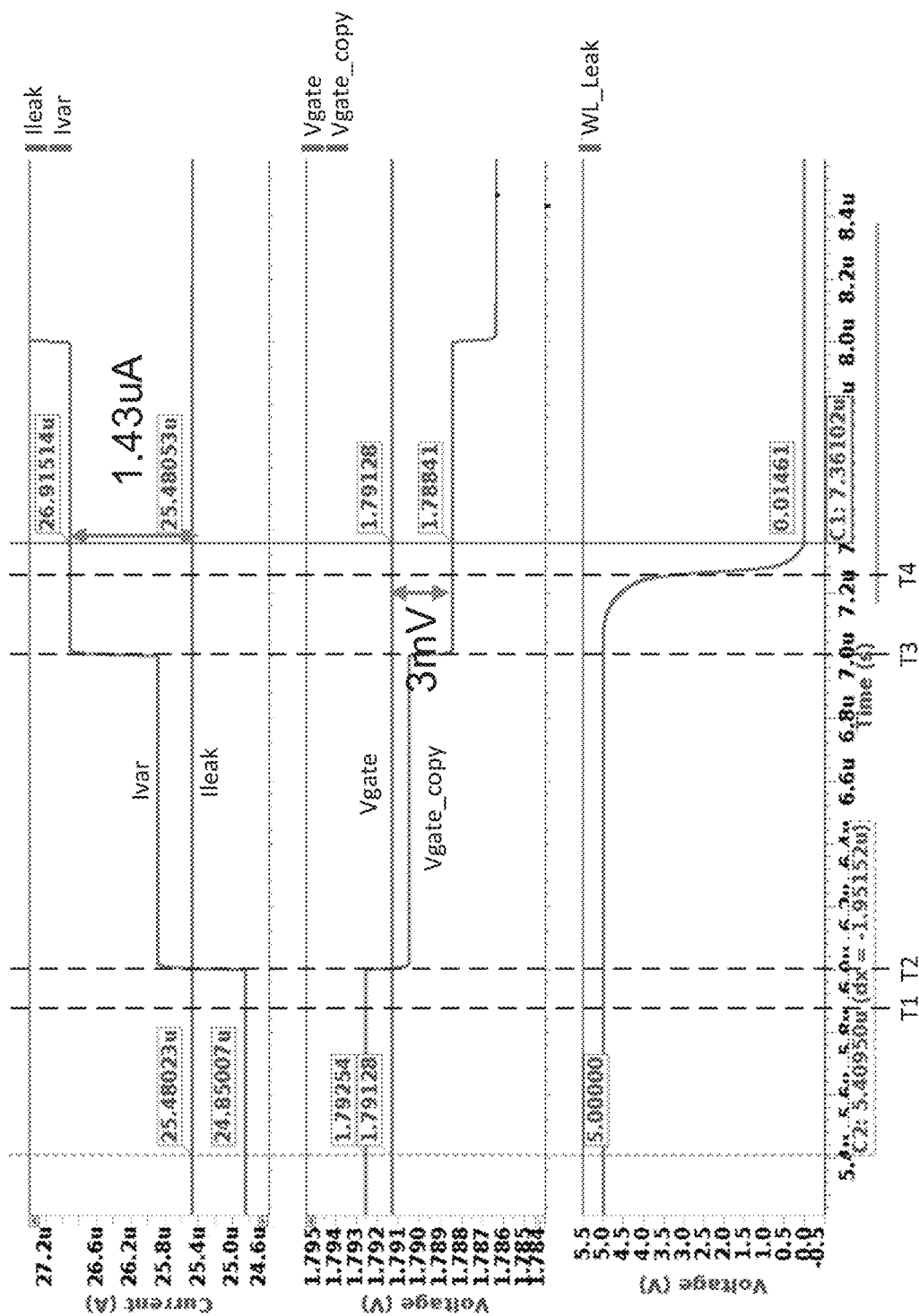
FIG. 13 is a graph showing the integrated circuit die of FIG. 2 in operation when performing row decoder leakage detection.

In response to WL_Leak being a logic low, the FSM 25 increments the configuration bits by a given amount, thereby increasing the current Ivar to a non-zero magnitude (Block 54), and waits for a time period of T (Block 55). As Ivar is increased, Vgate_copy falls in value, as explained above. This can be seen between what is labeled as time T2 and time T3 in FIGS. 12-13, where Vgate_copy falls due to the increase in Ivar. As to the time period T, this can be a fixed time period which is set so as to provide proper functionality in a worst-case scenario; however, additionally or alternatively, the duration of the time period T may be set by the FSM 25.

At the expiration of the time period of T, if Vgate_copy is still greater than Vgate (Block 56), this means that WL_Leak remains at a logic low. This condition can be observed in what is labeled as time T3 in FIG. 13. In response to WL_Leak remaining at a logic low at the expiration of the time period T, the FSM 25 again increments the configuration bits by the given amount (Block 57) to thereby increase the current Ivar, and again waits for a time period of T (back to Block 55). If this increase in Ivar is sufficient such that Vgate_copy becomes equal to, or less than, Vgate, then the amplifier 24 asserts the signal WL_Leak, which (at Block 56) then indicates that the current configuration bits are to be stored by the FSM 25. This condition can be observed at what is labeled as time T3 in FIG. 12 and time T4 in FIG. 13, where Vgate_copy has fallen in magnitude below Vgate, and therefore WL_Leak has been asserted.

These configuration bits, at which WL_Leak is first asserted, enable a determination of the leakage current from the row decoders. If these configuration bits are greater than a set value, for example, then this means that the leakage through the row decoders is greater than expected, and it can be inferred that the chip has suffered a process error and should be discarded or binned accordingly.

Thus, understand that the FSM 25 will keep incrementing the configuration bits, waiting a period of time T, and reading WL_Leak (e.g., repeating steps 57, 55, and 56) until WL_Leak becomes asserted. In some applications, WL_Leak may never become asserted, meaning that the variable current source 27 is incapable of generating a current equal to the leakage current from the word line decoders—in such situations, once the FSM 25 has incremented the configuration bits as high as it is programmed to be able to (or once the FSM has incremented the configuration bits past a certain threshold), and WL_Leak has not become asserted, it is also assumed that the chip has suffered a process error.

The above may be performed on every sector Sector[0], . . . , Sector[i] so as to test all chips on the wafer.

Operation of the non-volatile memory circuit 20 in a test mode in which word line leakage detection is performed is now described with additional reference to flowchart 60 of FIG. 3B. To begin word line leakage detection, the control bit EN_TEST is set (Block 61), enabling the leakage detector arrangement 23, the enabling including closing the S_EN_test switch. At this point, the sector from among sectors Sector[0], . . . , Sector[i] to test is selected (Block 62) by closing its associated switch from among switches S0, . . . , Si. Then, the configuration bits determined during row decoder leakage detection are used by the FSM 25 to program the variable current source 27 (Block 63). Thereafter, a desired word line to test is asserted, while the other word lines are deasserted (Block 64), and a time period T is waited (Block 65). If at the expiration of the time period T, WL_Leak is asserted (meaning that the magnitude of Ivar is sufficient to make Vgate_copy be equal to or less than Vgate), this means that the selected word line is not suffering from a resistive short (Block 66)—if the selected word line were suffering from a short, then the current configuration bits would cause the variable current source 27 to generate Ivar with an insufficient magnitude for Vgate_copy to be equal to or less than Vgate. Therefore, if at the expiration of the time period T, WL_Leak is asserted, it can be inferred that word line leakage is occurring, that the chip is suffering from a process error, and that the chip can therefore be discarded.

On the other hand, if at the expiration of the time period T, WL_Leak is asserted, it can be assumed that there is not an error with the selected word line, the selected word line is deselected, and a next word line is selected for testing (Block 67). Then, the FSM 25 again waits a time period T (Block 65), the FSM 25 again reads WL_Leak (Block 66), and the FSM 25 evaluates whether the currently selected word line is suffering from word line leakage based upon whether WL_Leak is asserted or not. This process (Blocks 66, 67, and 65) is repeated until all word lines within the selected sector have been evaluated. Likewise, this testing may be performed on every word line of every sector Sector[0], . . . , Sector[i] so as to test all chips on the wafer.

In the embodiment of the non-volatile memory circuit 20 shown, the amplifier 24 (configured as a comparator) in combination with the FSM 25 are respectively used to compare Vgate_copy to Vgate. However, in some cases, it may be desired to use a digital comparison of Vgate_copy to Vgate instead of the analog comparison performed with the non-volatile memory circuit 20.

Figure 4:
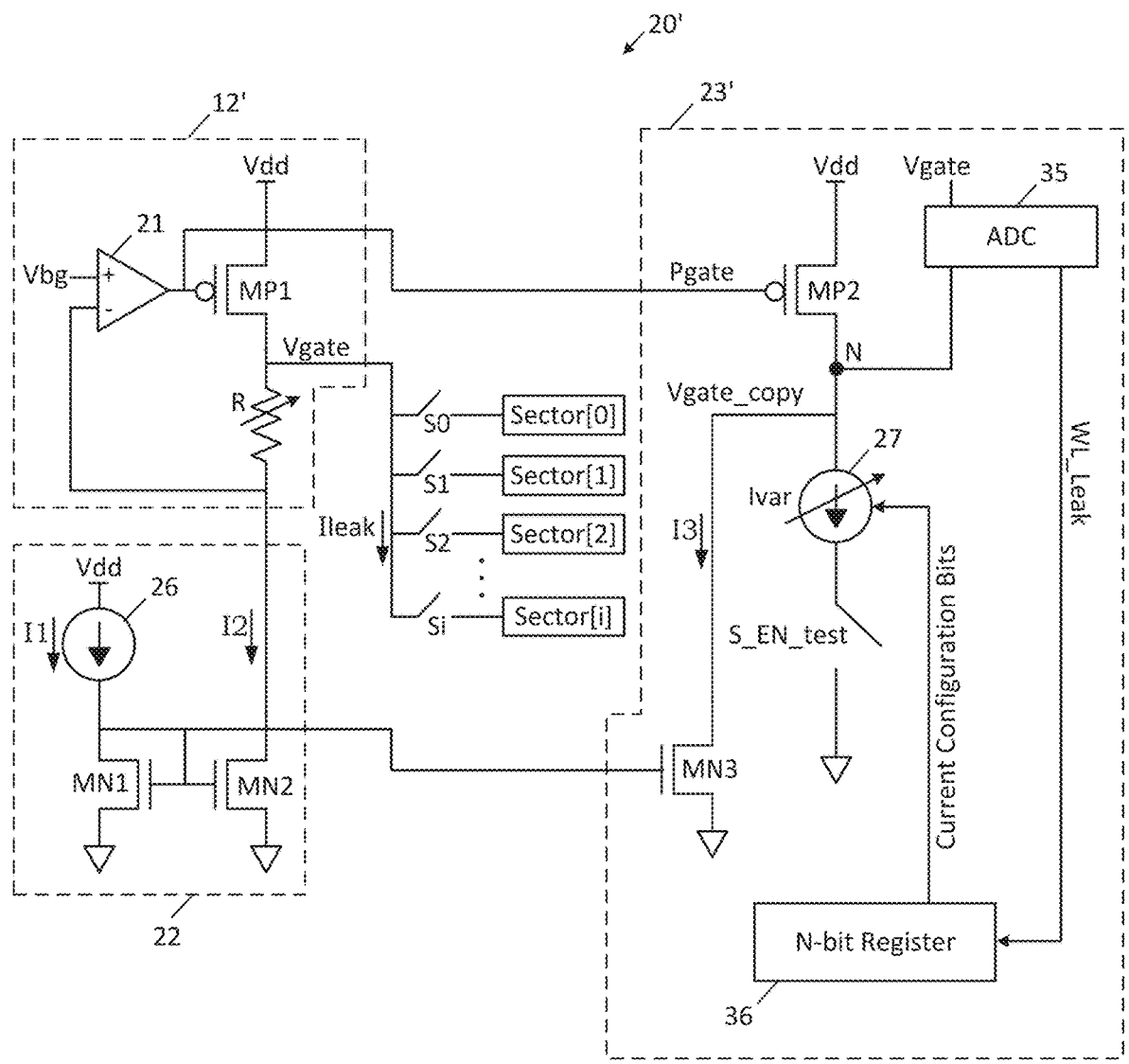
FIG. 4 is a schematic block diagram of a second embodiment of an integrated circuit die having built in test circuitry usable for performing row decoder leakage detection and word line leakage detection, as disclosed herein.

Such an embodiment is shown in FIG. 4. As compared to the non-volatile memory circuit 20, the current mirror arrangement 22 and regulator 12' remain the same. The difference here is that, instead of a comparator being used to compare Vgate to Vgate_copy, this comparison is performed digitally by an analog to digital converter (ADC) 35. Namely, the ADC 35 has inputs connected to receive Vgate and Vgate_copy. The ADC 35 digitizes these voltages, compares them to one another, and generates WL_Leak as a single bit digital signal representing whether or not Vgate_copy is less than or equal to Vgate. WL_Leak is provided to an N-bit register 36, which generates the configuration bits for the variable current source 27 based upon WL_Leak.

Therefore, with the non-volatile memory circuit 20', the difference over the non-volatile memory circuit 20 is the use of the ADC 35 to compare Vgate to Vgate_copy instead of the use of a comparator, and the generation of the configuration bits using an N-bit register 36 rather than a state machine. Otherwise, the actual operation of the non-volatile memory circuit 20' to perform row decoder leakage testing and word line leakage testing remains the same as described above.

Operation of the non-volatile memory circuit 20' in a test mode in which row decoder leakage detection is performed is now described with additional reference to flowchart 50 of FIG. 3A. To begin row decoder leakage detection, a control bit EN_TEST is set (Block 51), enabling the leakage detector arrangement 23, the enabling including closing the S_EN_test switch. At this point, the sector from among sectors Sector[0], . . . , Sector[i] to test is selected (Block 52) by closing its associated switch from among switches S0, . . . , Si, but none of the word lines of the selected sector are selected (e.g., no word line driver in the selected sector is asserting its output).

Initially at the beginning of row decoder leakage detection, the configuration bits stored in the N-bit Register 36 are zeros, and these configuration bits as output to the variable current source 27 cause the current Ivar to have a magnitude of zero (Block 53).

As previously explained, Vgate is a regulated voltage defined by R*I2+Vbg, and is independent of the leakage current Ileak flowing into the selected sector. On the other hand, Vgate_copy is generated a function of the voltage Pgate used to bias the gate of the PMOS transistor MP2 (itself dependent upon the leakage current Ileak into the selected sector), I3 (which is a replica of I1), and Ivar.

At this point due to Ivar being 0, Vgate_copy is greater than Vgate. As a result, the ADC 35 generates WL_Leak as a logic low.

In response to WL_Leak being a logic low, the N-bit register 36 increments the configuration bits by a given amount, thereby increasing the current Ivar to a non-zero magnitude (Block 54), and waits for a time period of T (Block 55). As Ivar is increased, Vgate_copy falls in value (because Ivar is subtracted from I3 at node N). At the expiration of the time period of T, if Vgate_copy is still greater than Vgate (Block 56), this means that WL_Leak remains at a logic low. In response to WL_Leak remaining at a logic low at the expiration of the time period T, the N-bit register 36 again increments the configuration bits by the given amount (Block 57) to thereby increase the current Ivar, and again waits for a time period of T (back to Block 55).

If this increase in Ivar is sufficient such that Vgate_copy becomes equal to, or less than, Vgate, then the ADC 35 asserts the signal WL_Leak, which (at Block 56) then indicates that the current configuration bits are to be stored by the N-bit register 36. These configuration bits, at which WL_Leak is first asserted, enable a determination of the leakage current from the row decoders. If these configuration bits are greater than a set value, for example, then this means that the leakage through the row decoders is greater than expected, and it can be inferred that the chip has suffered a process error and should be discarded or binned accordingly.

Thus, the N-bit register 36 will keep incrementing the configuration bits, waiting a period of time T, and reading WL_Leak (e.g., repeating steps 57, 55, and 56) until WL_Leak becomes asserted. In some applications, WL_Leak may never become asserted, meaning that the variable current source 27 is incapable of generating a current equal to the leakage current from the word line decoders—in such situations, once the N-bit register 36 has incremented the configuration bits as high as it is programmed to be able to, and WL_Leak has not become asserted, it is also assumed that the chip has suffered a process error. The above may be performed on every sector Sector[0], . . . , Sector[i] so as to test all chips on the wafer.

Operation of the non-volatile memory circuit 20' in a test mode in which word line leakage detection is performed is now described with additional reference to flowchart 60 of FIG. 3B. To begin word line leakage detection, the control bit EN_TEST is set (Block 61), enabling the leakage detector arrangement 23, the enabling including closing the S_EN_test switch. At this point, the sector from among sectors Sector[0], . . . , Sector[i] to test is selected (Block 62) by closing its associated switch from among switches S0, . . . , Si. Then, the configuration bits determined during row decoder leakage detection are used by the N-bit register 36 to program the variable current source 27 (Block 63).

Thereafter, a desired word line to test is asserted, while the other word lines are deasserted (Block 64), and a time period T is waited (Block 65). If at the expiration of the time period T, WL_Leak is asserted, this means that the selected word line is not suffering from a resistive short (Block 66)—if the selected word line were suffering from a short, then the current configuration bits would cause the variable current source 27 to generate Ivar with an insufficient magnitude for Vgate_copy to be equal to or less than Vgate. Therefore, if at the expiration of the time period T, WL_Leak is not asserted, it can be inferred that word line leakage is occurring, that the chip is suffering from a process error, and that the chip can therefore be discarded.

On the other hand, if at the expiration of the time period T, WL_Leak is asserted, it can be assumed that there is not an error with the selected word line, the selected word line is deselected, and a next word line is selected for testing (Block 67). Then, the N-bit register 36 again waits a time period T (Block 65), the N-bit register 36 again reads WL_Leak (Block 66), and it can be evaluated whether the currently selected word line is suffering from word line leakage based upon whether WL_Leak is asserted or not. This process (Blocks 66, 67, and 65) is repeated until all word lines within the selected sector have been evaluated. Likewise, this testing may be performed on every word line of every sector Sector[0], . . . , Sector[i] so as to test all chips on the wafer.

Figure 5:
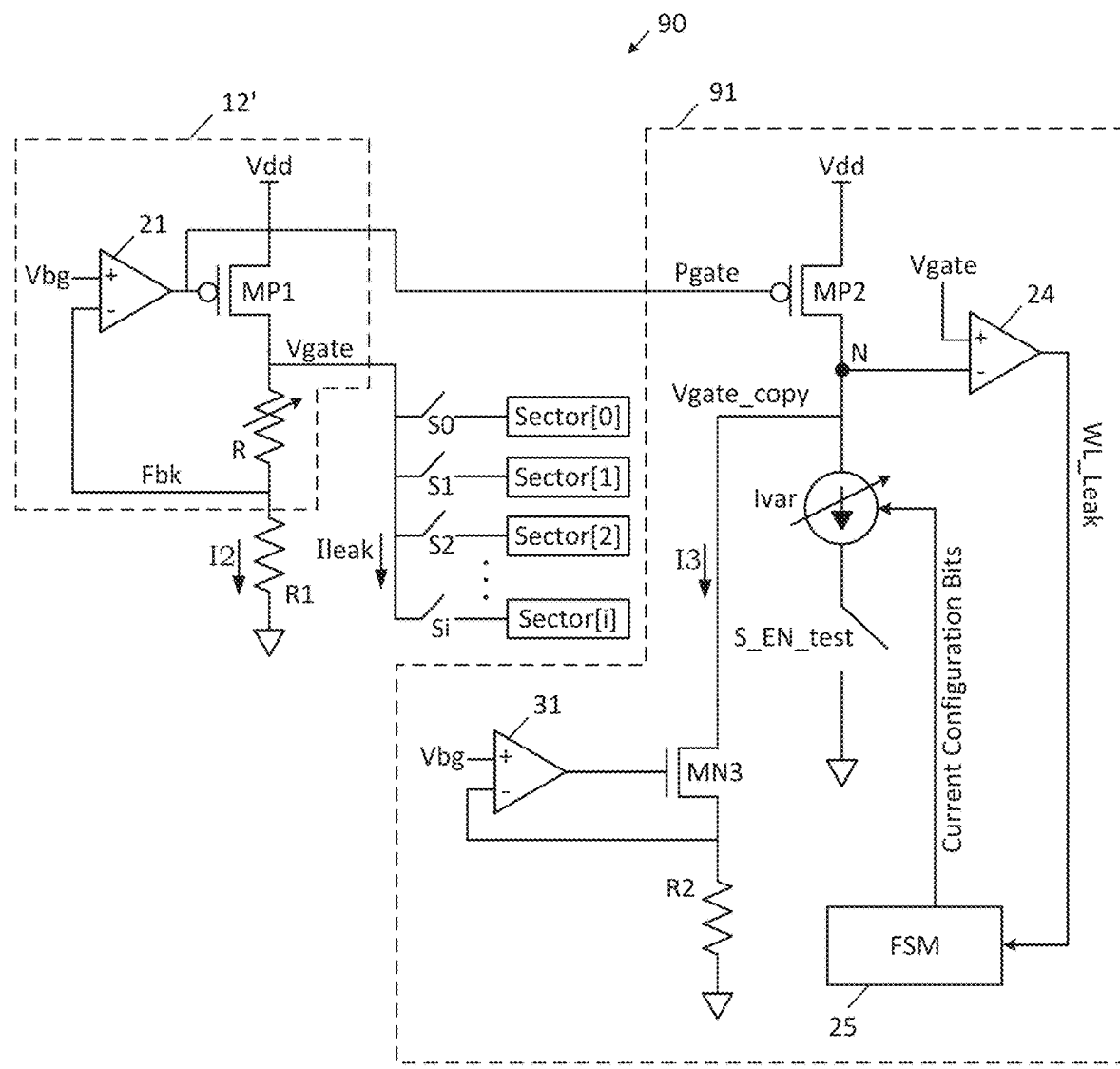
FIG. 5 is a schematic block diagram of a third embodiment of an integrated circuit die having built in test circuitry usable for performing row decoder leakage detection and word line leakage detection, as disclosed herein.

Another embodiment of the non-volatile memory circuit 90 is now described with reference to FIG. 5. Differently than the non-volatile memory circuit 20 of FIG. 2, the non-volatile memory circuit 90 lacks the current mirror arrangement. Instead, the second terminal of the adjustable resistor R is connected to ground through an additional resistor R1, so the feedback signal Fbk is produced at a tap of the voltage divider formed by the adjustable resistor R and the resistor R1. Through the adjusting/trimming of resistor R and the selection of the resistance value of resistor R1, a current I2 is sunk from the drain of PMOS transistor MP1. Also here, due to the lack of the current mirror arrangement, n-channel transistor MN3 has its source connected to ground through a resistor R2 and its gate controlled by the output of an amplifier 31. The amplifier 31 has its non-inverting terminal connected to receive the bandgap voltage Vbg, has its inverting terminal connected to the source of the n-channel transistor MN3, and as stated has its output connected to the gate of the n-channel transistor MN3, forming a voltage regulator. Thus, through selection of the resistance value of resistor R2, the current I3 (a replica of the current I2) is sunk from node N.

Therefore, with the non-volatile memory circuit 90, the difference over the non-volatile memory circuit 20 is in the generation of the currents I2 and I3. The actual operation of the non-volatile memory circuit 90 to perform row decoder leakage testing and word line leakage testing remains the same as described above.

Figure 6:
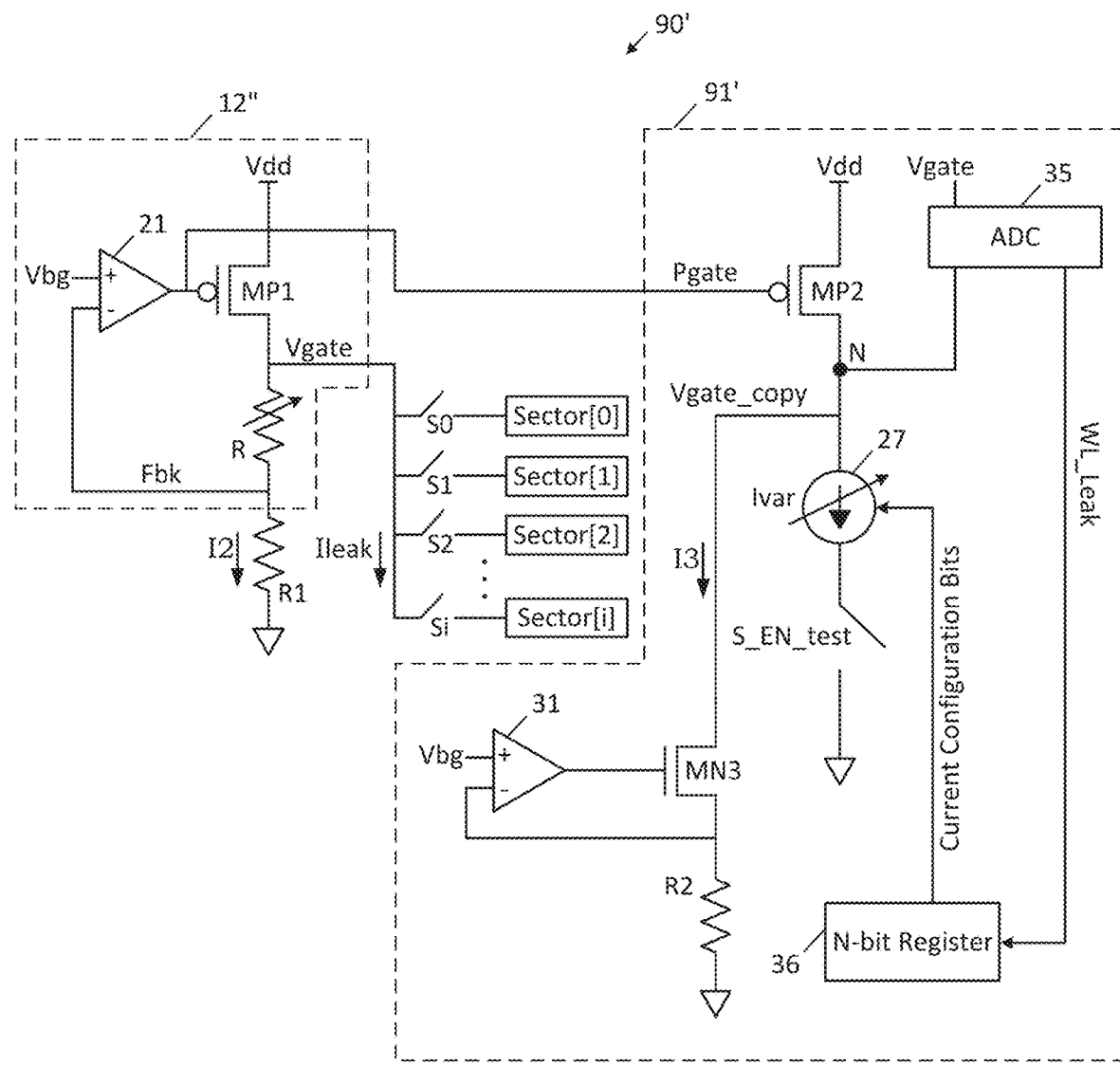
FIG. 6 is a schematic block diagram of a fourth embodiment of an integrated circuit die having built in test circuitry usable for performing row decoder leakage detection and word line leakage detection, as disclosed herein.

Another embodiment of the non-volatile memory circuit 90' is now described with reference to FIG. 6. Note that, as compared to the non-volatile memory circuit 90, the regulator 12' and the generation of the currents I2 and I3 remain the same. The difference here is that, instead of a comparator being used to compare Vgate to Vgate_copy, this comparison is performed digitally by an analog to digital converter (ADC) 35. The ADC 35 has inputs connected to receive Vgate and Vgate_copy. The ADC 35 digitizes these voltages, compares them to one another, and generates WL_Leak as a single bit digital signal representing whether or not Vgate_copy is less than or equal to Vgate. WL_Leak is provided to an N-bit register 36, which generates the configuration bits for the variable current source 27 based upon WL_Leak.

Therefore, with the non-volatile memory circuit 90', the difference over the non-volatile memory circuit 90 is the use of the ADC 35 to compare Vgate to Vgate_copy instead of the use of a comparator, and the generation of the configuration bits using an N-bit register 36 rather than a state machine. Otherwise, the actual operation of the non-volatile memory circuit 90 to perform row decoder leakage testing and word line leakage testing remains the same as described above.

Figure 7:
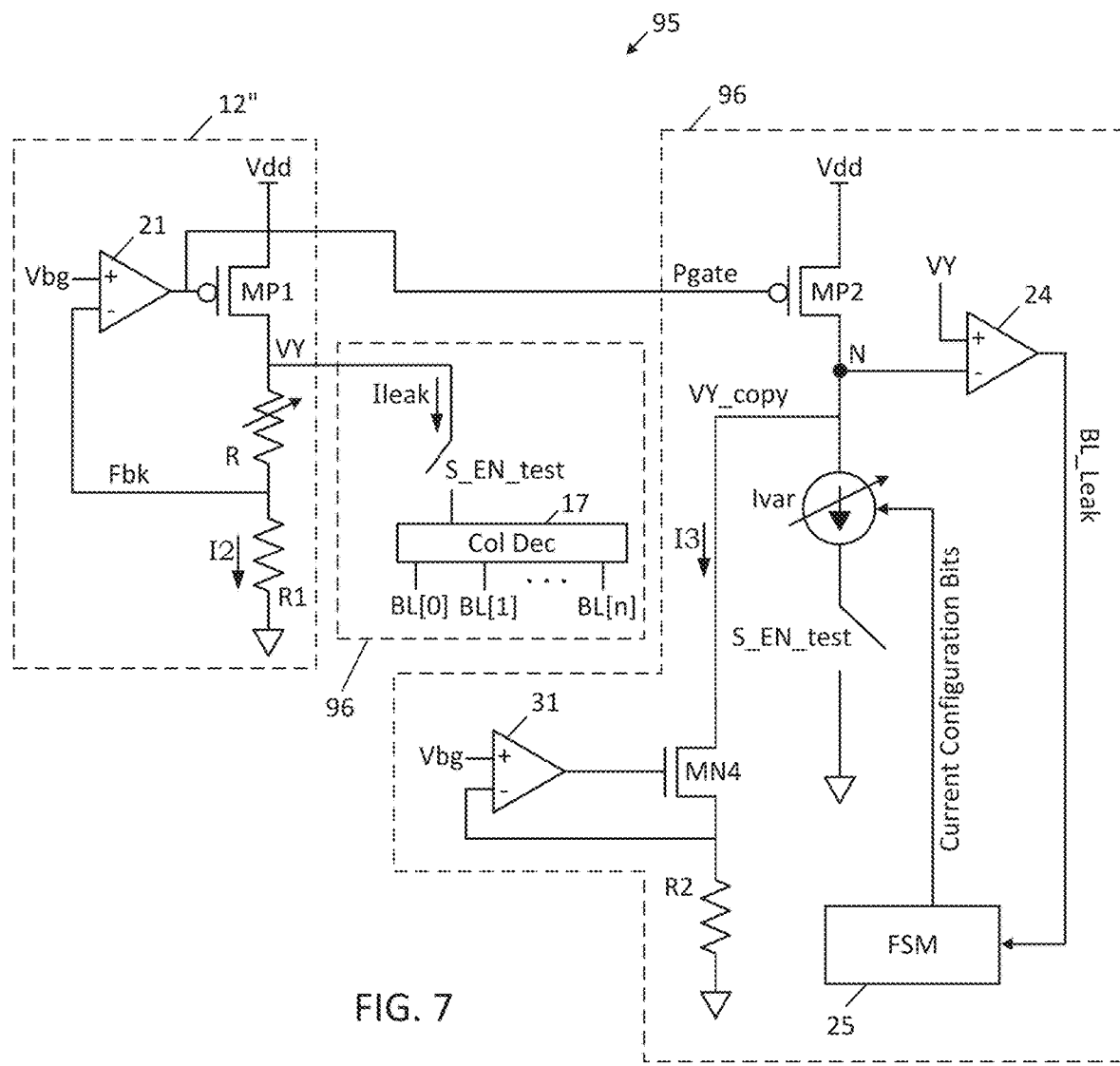
FIG. 7 is a schematic block diagram of a first embodiment of an integrated circuit die having built in test circuitry usable for performing bit line leakage detection, as disclosed herein.

Another embodiment of the non-volatile memory circuit 95 is now described with reference to FIG. 7. Note that, as compared to the non-volatile memory circuit 90 of FIG. 5, here the non-volatile memory circuit 95 is used to test leakage of the bit lines of the memory arrays of the sectors. In particular, a voltage VY is produced at the drain of the PMOS transistor MP1 from the current I2 minus the leakage current Ileak to the selected bit line BL. Likewise, a copy voltage VY_copy is produced at node N based upon the current I3 (that is a replica of current I2) minus the variable current Ivar. Furthermore, the comparator 24 determines whether VY_copy is equal to or less than the voltage VY.

Notice that VY is a regulated voltage independent of the leakage current Ileak into the selected bit line of the selected sector, and is equal to Vbg*(1+R/R1). However, Pgate (used to bias the gate of PMOS transistor MP2) is dependent upon the leakage current Ileak. The greater the leakage current, the lower Pgate will be to enable the PMOS transistor MP1 to provide the requisite current; likewise, the lesser the leakage current, the higher Pgate will be so as to lower the current sourced by the PMOS transistor MP1 to be such that VY remains at Vbg*(1+R/R1). As a consequence of I3 being a replica of current I2, while the drain current of PMOS transistor MP2 is equal to the drain current of PMOS transistor MP1, VY_copy will be dependent upon Ivar, and will be equal to VY if Ivar=Ileak.

Figure 8:
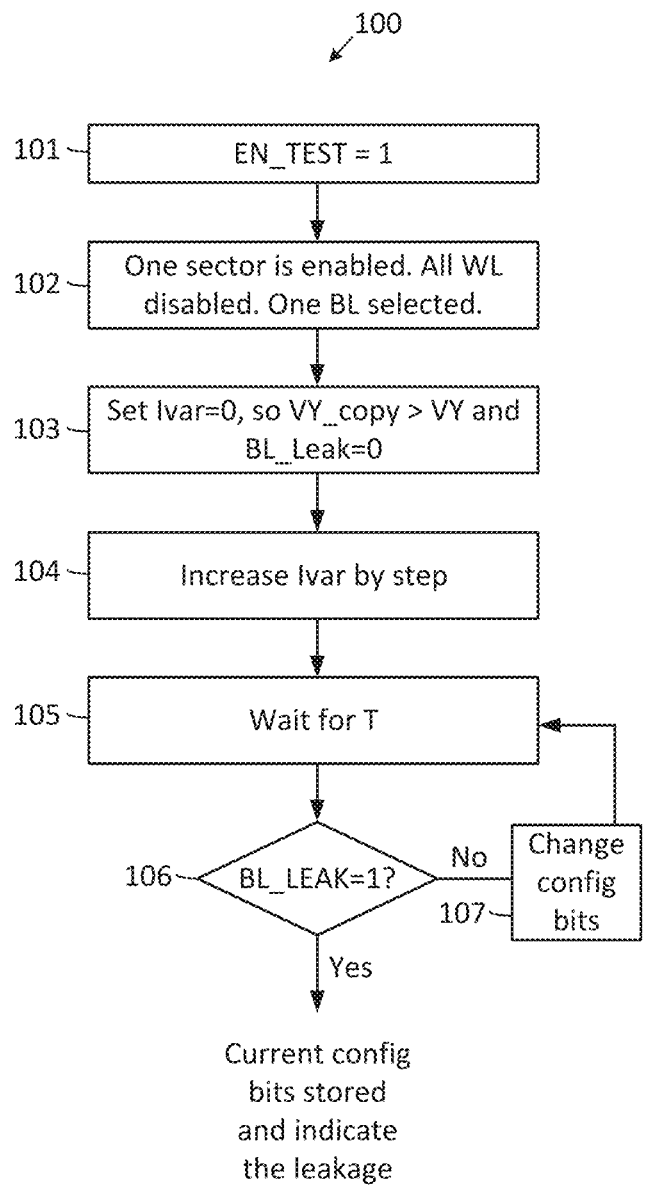
FIG. 8 is a flowchart showing steps for operating the integrated circuit die of FIG. 7 for performing bit line leakage detection.

Keeping this in mind, operation of the non-volatile memory circuit 95 in a test mode in which bit line leakage detection is performed is now described with additional reference to flowchart 100 of FIG. 8. To begin bit line leakage detection, a control bit EN_TEST is set (Block 101), enabling the leakage detector arrangement 96, the enabling including closing the S_EN_test switch. At this point, the sector from among sectors Sector[0], . . . , Sector[i] to test is selected (Block 102), but none of the word lines of the selected sector are selected (e.g., no word line driver in the selected sector is asserting its output), while one bit line from among bit lines BL[0], BL[n] is selected to force the voltage VY on the selected bit line, while the other bit lines are clamped to ground.

Then, the FSM 25 sets the configuration bits such that the current Ivar generated by the variable current generator 27 has a magnitude of zero (Block 103). At this point, the magnitude of the current Ivar is zero. Thus, at this point, VY_copy is greater than VY. Since the amplifier 24 is arranged as a comparator, VY_copy at its inverting terminal being greater than VY at its non-inverting terminal means that its output it not asserted—BL_Leak is at a logic low.

In response to BL_Leak being a logic low, the FSM 25 increments the configuration bits by a given amount, thereby increasing the current Ivar to a non-zero magnitude (Block 104), and waits for a time period of T (Block 105). As Ivar is increased, VY_copy falls in value. At the expiration of the time period of T, if VY_copy is still greater than VY (Block 106), this means that BL_Leak remains at a logic low. In response to BL_Leak remaining at a logic low at the expiration of the time period T, the FSM 25 again increments the configuration bits by the given amount (Block 107) to thereby increase the current Ivar, and again waits for a time period of T (back to Block 105). If this increase in Ivar is sufficient such that VY_copy becomes equal to, or less than, VY, then the amplifier 24 asserts the signal BL_Leak, which (at Block 106) then indicates that the current configuration bits are to be stored by the FSM 25. These configuration bits, at which BL_Leak is first asserted, enable a determination of the leakage current from selected bit line. If these configuration bits are greater than a set value, for example, then this means that the leakage through the selected bit line is greater than expected, and it can be inferred that the chip has suffered a process error and should be discarded or binned accordingly.

Thus, understand that the FSM 25 will keep incrementing the configuration bits, waiting a period of time T, and reading BL_Leak (e.g., repeating steps 107, 105, and 106) until BL_Leak becomes asserted. In some applications, BL_Leak may never become asserted, meaning that the variable current source 27 is incapable of generating a current equal to the leakage current from the bit lines—in such situations, once the FSM 25 has incremented the configuration bits as high as it is programmed to be able to, and BL_Leak has not become asserted, it is also assumed that the chip has suffered a process error.

This process (Blocks 106, 107, and 105) is repeated until all bit lines within the selected sector have been evaluated. The above may be performed on every sector Sector[0], . . . , Sector[i] so as to test all chips on the wafer.

It may be desired to use a digital comparison of VY_copy to VY instead of the analog comparison performed with the non-volatile memory circuit 20.

Figure 9:
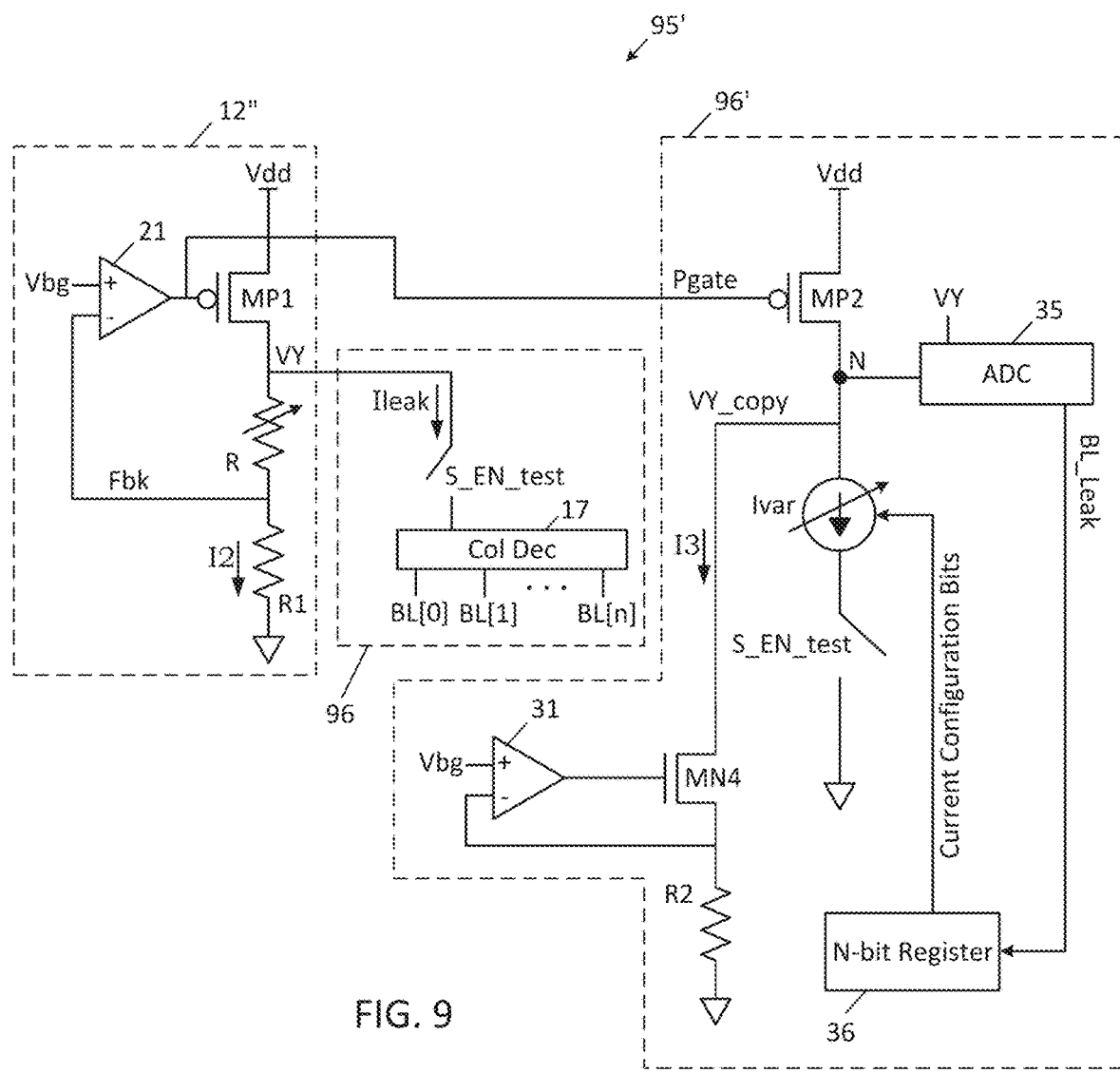
FIG. 9 is a schematic block diagram of a second embodiment of an integrated circuit die having built in test circuitry usable for performing bit line leakage detection, as disclosed herein.

Such an embodiment is shown in FIG. 9. As compared to the non-volatile memory circuit 95', the regulator 12" remains the same. The difference here is that, instead of a comparator being used to compare VY to VY_copy, this comparison is performed digitally by an analog to digital converter (ADC) 35. Namely, the ADC 35 has inputs connected to receive VY and VY_copy. The ADC 35 digitizes these voltages, compares them to one another, and generates BL_Leak as a single bit digital signal representing whether or not VY_copy is less than or equal to VY. BL_Leak is provided to an N-bit register 36, which generates the configuration bits for the variable current source 27 based upon BL_Leak.

Therefore, with the non-volatile memory circuit 95', the difference over the non-volatile memory circuit 95 is the use of the ADC 35 to compare VY to VY_copy instead of the use of a comparator, and the generation of the configuration bits using an N-bit register 36 rather than a state machine. Otherwise, the actual operation of the non-volatile memory circuit 95' to perform bit line leakage testing remains the same as described above.

Operation of the non-volatile memory circuit 95' in a test mode in which bit line leakage detection is performed is now described with additional reference to flowchart 100 of FIG. 8. To begin bit line leakage detection, a control bit EN_TEST is set (Block 101), enabling the leakage detector arrangement 96, the enabling including closing the S_EN_test switch. At this point, the sector to test is selected (Block 102), but none of the word lines of the selected sector are selected (e.g., no word line driver in the selected sector is asserting its output) and one bit line from among the bit lines BL[0], . . . , BL[n] is selected Initially at the beginning of bit line leakage detection, the configuration bits stored in the N-bit Register 36 are zeros, and these configuration bits as output to the variable current source 27 cause the current Ivar to have a magnitude of zero (Block 103).

As previously explained, at this point due to Ivar being 0, VY_copy is greater than VY. As a result, the ADC 35 generates BL_Leak as a logic low.

In response to BL_Leak being a logic low, the N-bit register 36 increments the configuration bits by a given amount, thereby increasing the current Ivar to a non-zero magnitude (Block 104), and waits for a time period of T (Block 105). As Ivar is increased, VY_copy falls in value (because Ivar is subtracted from I3 at node N). At the expiration of the time period of T, if VY_copy is still greater than VY (Block 106), this means that BL_Leak remains at a logic low. In response to BL_Leak remaining at a logic low at the expiration of the time period T, the N-bit register 36 again increments the configuration bits by the given amount (Block 107) to thereby increase the current Ivar, and again waits for a time period of T (back to Block 105).

If this increase in Ivar is sufficient such that VY_copy becomes equal to, or less than, VY, then the ADC 35 asserts the signal VY_Leak, which (at Block 106) then indicates that the current configuration bits are to be stored by the N-bit register 36. These configuration bits, at which BL_Leak is first asserted, enable a determination of the leakage current from the selected bit line. If these configuration bits are greater than a set value, for example, then this means that the leakage through the selected bit line is greater than expected, and it can be inferred that the chip has suffered a process error and should be discarded or binned accordingly.

Thus, the N-bit register 36 will keep incrementing the configuration bits, waiting a period of time T, and reading BL_Leak (e.g., repeating steps 107, 105, and 106) until BL_Leak becomes asserted. In some applications, BL_Leak may never become asserted, meaning that the variable current source 27 is incapable of generating a current equal to the leakage current from the selected bit line—in such situations, once the N-bit register 36 has incremented the configuration bits as high as it is programmed to be able to, and BL_Leak has not become asserted, it is also assumed that the chip has suffered a process error. This process (Blocks 106, 107, and 105) is repeated until all bit lines within the selected sector have been evaluated. The above may be performed on every sector Sector[0], . . . , Sector[i] so as to test all chips on the wafer.

Another embodiment of the non-volatile memory circuit 97 is now described with reference to FIG. 10. Differently than the non-volatile memory circuit 95 of FIG. 7, the non-volatile memory circuit 97 uses the current mirror arrangement 22 described above to sink the current I2 (a replica of current I1) from the adjustable resistor R, and to replicate current I1 as current I3 sink from node N.

Therefore, with the non-volatile memory circuit 97, the difference over the non-volatile memory circuit 95 is in the generation of the currents I2 and I3. The actual operation of the non-volatile memory circuit 97 to perform bit line leakage testing remains the same as described above.

Another embodiment of the non-volatile memory circuit 97' is now described with reference to FIG. 11. Note that, as compared to the non-volatile memory circuit 97, the regulator 12' and the generation of the currents I2 and I3 remain the same. The difference here is that, instead of a comparator being used to compare VY to VY_copy, this comparison is performed digitally by an analog to digital converter (ADC) 35. The ADC 35 has inputs connected to receive VY and VY_copy. The ADC 35 digitizes these voltages, compares them to one another, and generates BL_Leak as a single bit digital signal representing whether or not VY_copy is less than or equal to VY. BL_Leak is provided to an N-bit register 36, which generates the configuration bits for the variable current source 27 based upon BL_Leak.

Therefore, with the non-volatile memory circuit 97', the difference over the non-volatile memory circuit 97 is the use of the ADC 35 to compare VY to VY_copy instead of the use of a comparator, and the generation of the configuration bits using an N-bit register 36 rather than a state machine. Otherwise, the actual operation of the non-volatile memory circuit 97 to perform bit line leakage testing remains the same as described above.

It should be understood that a given integrated circuit die may include both a leakage detector arrangement for use in determining row decoder and word line leakage detection as well as a leakage detector arrangement for use in determining bit line leakage detection.

In the above described embodiments, replica currents I2 and I3 that are replicas of the current I1, and a replica current I3 that is a replica of the current I2, are described. Note that in some applications, these replica currents may instead be scaled, in which case an equal scaling is provided to the variable current as well as to the size of transistor MP2.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An integrated circuit die including a plurality of memory sectors, each memory sector including a memory array, the integrated circuit die comprising:
a voltage regulator including a first transistor driven by an output voltage to thereby generate a gate voltage, the output voltage being generated based upon a difference between a constant current and a leakage current;
a selection circuit configured to selectively couple the gate voltage to a selected one of the plurality of memory sectors; and
a leakage detector circuit configured to:
drive a second transistor with the output voltage to thereby generate a copy voltage based upon a difference between a variable current and a replica of the constant current;
increase the variable current in response to the copy voltage being greater than the gate voltage; and
assert a leakage detection signal in response to the copy voltage being less than the gate voltage, the leakage detection signal indicating excess leakage within the memory array of the selected one of the memory sectors.

2. The integrated circuit die of claim 1, wherein the leakage detector circuit is configured to detect excess leakage within row decoders of the selected one of the memory sectors by operating to:
a) deselect all word lines within the memory array of the selected one of the memory sectors;
b) set the variable current to have a magnitude that is within a threshold of zero;
c) increase the variable current by a given amount, in response to the copy voltage being greater than the gate voltage, and wait a given period of time;
d) when the increase in the variable current by the given amount results in the copy voltage becoming less than the gate voltage, assert the leakage detection signal to thereby indicate excess leakage within the row decoders of the selected one of the memory sectors; and
e) when the increase in the variable current by the given amount does not result in the copy voltage becoming less than the gate voltage, return to c).

3. The integrated circuit die of claim 2, wherein the leakage detector circuit is further configured to detect excess leakage within word lines of the selected one of the memory sectors by operating to:
f) select a word line within the memory array of the selected one of the memory sectors while maintaining a remainder of the word lines deselected;
g) wait a given period of time;
h) when the selection of the word line results in the gate voltage becoming less than the copy voltage, de-assert the leakage detection signal to thereby indicate excess leakage within the selected word line of the selected one of the memory sectors; and
i) when the selection of the word line does not result in the gate voltage becoming less than the copy voltage, assert the leakage detection signal to thereby indicate a lack of excess leakage within the selected word line.

4. The integrated circuit die of claim 1, further comprising a current source configured to generate the constant current, and a current mirror arrangement configured to generate the replica of the constant current.

5. The integrated circuit die of claim 1, wherein the leakage detector circuit comprises:
a variable current source configured to generate the variable current in response to a control signal;
a comparator configured to compare the gate voltage to the copy voltage and assert the leakage detection signal in response to the copy voltage being less than the gate voltage; and
a control circuit configured to generate the control signal and increment the control signal in response to the leakage detection signal being asserted.

6. The integrated circuit die of claim 1, wherein the voltage regulator comprises:
a comparator configured to generate an output voltage based upon a comparison between a reference voltage and a feedback voltage; and
wherein the first transistor has a control terminal coupled to receive the output voltage and has a first conduction terminal at which the gate voltage is generated.

7. The integrated circuit die of claim 6, further comprising:
wherein the second transistor has a control terminal coupled to receive the output voltage from the comparator of the voltage regulator, and has a first conduction terminal at which the copy voltage is generated based upon the difference between the variable current and the replica of the constant current;
wherein the second transistor is a replica of the first transistor;
a variable current source coupled to the first conduction terminal of the second transistor and configured to generate the variable current in response to a control signal;
a comparator having a non-inverting input coupled to receive the gate voltage, an inverting input coupled to the first conduction terminal of the second transistor, and an output at which the leakage detection signal is asserted in response to the copy voltage being less than the gate voltage; and
a control circuit configured to generate the control signal and increment the control signal in response to the leakage detection signal being asserted.

8. The integrated circuit die of claim 7, wherein the first transistor comprises a first PMOS transistor having a source coupled to a supply voltage, a drain at which the gate voltage is produced, and a gate coupled to receive the output voltage of the comparator; and wherein the second transistor comprises a second PMOS transistor having a source coupled to a supply voltage, a drain at which the copy voltage is produced, and a gate coupled to receive the output voltage of the comparator.

9. The integrated circuit die of claim 8, wherein the comparator of the voltage regulator includes a non-inverting terminal coupled to receive a reference voltage, an inverting terminal coupled to receive the feedback voltage, and an output at which the output voltage is generated; and wherein the voltage regulator further comprises a resistance coupled between the drain of the first PMOS transistor and the inverting terminal of the comparator of the voltage regulator.

10. The integrated circuit die of claim 9, further comprising:
a current source configured to generate the constant current; and
a current mirror having an input coupled to receive the constant current, and first and second outputs at which the replica of the constant current is sunk, the first output being coupled to the resistance, the second output being coupled to the inverting input of the comparator of the leakage detector circuit.

11. The integrated circuit die of claim 7, further comprising a current source configured to generate the constant current, and a current mirror arrangement configured to generate the replica of the constant current.

12. The integrated circuit die of claim 6, further comprising:
wherein the second transistor has a control terminal coupled to receive the output voltage from the comparator of the voltage regulator, and has a first conduction terminal at which the copy voltage is generated based upon the difference between the variable current and the replica of the constant current;
wherein the second transistor is a replica of the first transistor;
a variable current source coupled to the first conduction terminal of the second transistor and configured to generate the variable current in response to a control signal;
an analog to digital conversion circuit configured to digitize the gate voltage and the copy voltage, compare the gate voltage to the copy voltage after digitization, to generate the leakage detection signal as asserted in response to the copy voltage being less than the gate voltage, and to generate the leakage detection signal as deasserted in response to the copy voltage being greater than the gate voltage; and
a control circuit configured to generate the control signal, and to increment the control signal in response to the leakage detection signal being asserted.

13. The integrated circuit die of claim 12,
wherein the first transistor comprises a first PMOS transistor having a source coupled to a supply voltage, a drain at which the gate voltage is produced, and a gate coupled to receive the output voltage of the comparator of the voltage regulator; and wherein the second transistor comprises a second PMOS transistor having a source coupled to a supply voltage, a drain at which the copy voltage is produced, and a gate coupled to receive the output voltage of the comparator of the voltage regulator; and wherein the comparator of the voltage regulator includes a non-inverting terminal coupled to receive a reference voltage, an inverting terminal coupled to receive the feedback voltage, and an output at which the output voltage is generated; and wherein the voltage regulator further comprises a resistance coupled between the drain of the first PMOS transistor and the inverting terminal of the comparator of the voltage regulator.

14. The integrated circuit die of claim 13, further comprising:
a current source configured to generate the constant current; and
a current mirror having an input coupled to receive the constant current, and first and second outputs at which the replica of the constant current is sunk, the first output being coupled to the resistance, the second output being coupled to the inverting terminal of the comparator of the leakage detector circuit.

15. The integrated circuit die of claim 12, further comprising:
a current source configured to generate the replica of the constant current; and
wherein the voltage regulator is configured to generate the constant current.

16. The integrated circuit die of claim 7, further comprising:
a current source configured to generate the replica of the constant current; and
wherein the voltage regulator is configured to generate the constant current.

17. The integrated circuit die of claim 1, wherein the leakage detector circuit is configured to detect excess leakage within bit lines of the selected one of the memory sectors by operating to:
a) deselect all word lines within the memory array of the selected one of the memory sectors, select one bit line within the memory array;
b) set the variable current to have a magnitude that is within a threshold of zero;
c) increase the variable current by a given amount, in response to the copy voltage being greater than the gate voltage, and wait a given period of time;
d) when the increase in the variable current by the given amount results in the copy voltage becoming less than the gate voltage, assert the leakage detection signal to thereby indicate excess leakage within the selected bit line; and
e) when the increase in the variable current by the given amount does not result in the copy voltage becoming less than the gate voltage, return to c).

18. A method of testing an integrated circuit die that includes a plurality of memory sectors, with each memory sector including a memory array, the method comprising:
generating an output voltage based upon a difference between a constant current and a leakage current;
driving a first transistor with the output voltage to produce a gate voltage, the gate voltage being a regulated voltage;
connecting the gate voltage to a selected one of the plurality of memory sectors;
driving a second transistor with the output voltage to thereby generate a copy voltage based upon a difference between a variable current and a replica of the constant current;
increasing the variable current in response to the copy voltage being greater than the gate voltage; and asserting a leakage detection signal in response to the copy voltage being less than the gate voltage, the leakage detection signal indicating excess leakage within the memory array of the selected one of the memory sectors.

19. The method of claim 18, further comprising detecting excess leakage within row decoders of the selected one of the plurality of memory sectors by:
   a) deselecting all word lines within the memory array of the selected one of the memory sectors;
   b) setting the variable current to have a magnitude that is within a threshold of zero;
   c) increasing the variable current by a given amount, in response to the copy voltage being greater than the gate voltage, and waiting a given period of time;
   d) when the increase in the variable current by the given amount results in the copy voltage becoming less than the gate voltage, asserting the leakage detection signal to thereby indicate excess leakage within the row decoders of the selected one of the memory sectors; and
   e) when the increase in the variable current by the given amount does not result in the copy voltage becoming less than the gate voltage, returning to step c).

20. The method of claim 19, further comprising detecting excess leakage within word lines of the selected one of the memory sectors by:
   f) selecting a word line within the memory array of the selected one of the memory sectors, while maintaining a remainder of the word lines deselected;
   g) waiting a given period of time;
   h) when the selection of the word line results in the gate voltage becoming less than the copy voltage, de-asserting the leakage detection signal to thereby indicate excess leakage within the selected word line of the selected one of the memory sectors; and
   i) when the selection of the word line does not result in the gate voltage becoming less than the copy voltage, asserting the leakage detection signal to thereby indicate a lack of excess leakage within the selected word line.

21. The method of claim 18, further comprising detecting excess leakage within bit lines of the selected one of the memory sectors by:
   a) deselecting all word lines within the memory array of the selected one of the memory sectors, and selecting one bit line within the memory array;
   b) setting the variable current to have a magnitude that is within a threshold of zero;
   c) increasing the variable current by a given amount, in response to the copy voltage being greater than the gate voltage, and waiting a given period of time;
   d) when the increase in the variable current by the given amount results in the copy voltage becoming less than the gate voltage, asserting the leakage detection signal to thereby excess leakage within the selected bit line; and
   e) when the increase in the variable current by the given amount does not result in the copy voltage becoming less than the gate voltage, returning to c).

* * * * *